United States Patent
Rupp et al.

(10) Patent No.: US 9,818,818 B2
(45) Date of Patent: Nov. 14, 2017

(54) POWER SEMICONDUCTOR DEVICE INCLUDING TRENCH GATE STRUCTURES WITH LONGITUDINAL AXES TILTED TO A MAIN CRYSTAL DIRECTION

(71) Applicant: Infineon Technologies AG, Neubiberg (DE)

(72) Inventors: Roland Rupp, Lauf (DE); Romain Esteve, Villach (AT); Dethard Peters, Hoechstadt (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/057,669

(22) Filed: Mar. 1, 2016

(65) Prior Publication Data

US 2016/0260798 A1    Sep. 8, 2016

(30) Foreign Application Priority Data

Mar. 3, 2015 (DE) .......................... 10 2015 103 070

(51) Int. Cl.
*H01L 29/04* (2006.01)
*H01L 29/423* (2006.01)
(Continued)

(52) U.S. Cl.
CPC ...... *H01L 29/045* (2013.01); *H01L 21/02609* (2013.01); *H01L 29/1608* (2013.01);
(Continued)

(58) Field of Classification Search
CPC ............... H01L 29/045; H01L 29/4236; H01L 29/7397; H01L 29/66734; H01L 29/66348;
(Continued)

(56) References Cited

U.S. PATENT DOCUMENTS

| 2011/0017998 A1* | 1/2011 | Nakano | ................. | H01L 21/046 257/66 |
| 2013/0001592 A1* | 1/2013 | Miyahara | ............ | H01L 29/4236 257/77 |

(Continued)

FOREIGN PATENT DOCUMENTS

| DE | 10 2008 039 845 A1 | 3/2009 |
| JP | 2003-300797 A | 10/2003 |

(Continued)

OTHER PUBLICATIONS

Office Action communication of the German Patent and Trademark Office for Appln. Ser. No. 102015103070.5, dated Oct. 9, 2015.

(Continued)

*Primary Examiner* — Steven Loke
*Assistant Examiner* — Juanita Rhodes
(74) *Attorney, Agent, or Firm* — Baker Botts L.L.P.

(57) ABSTRACT

A semiconductor device includes a semiconductor body with a first main crystal direction parallel to a horizontal plane. Longitudinal axes of trench gate structures are tilted to the first main crystal direction by a tilt angle of at least 2 degree and at most 30 degree in the horizontal plane. Mesa portions are between neighboring trench gate structures. First sidewall sections of first mesa sidewalls are main crystal planes parallel to the first main crystal direction. Second sidewall sections tilted to the first sidewall sections connect the first sidewall sections.

15 Claims, 8 Drawing Sheets

(51) Int. Cl.
*H01L 29/739* (2006.01)
*H01L 29/66* (2006.01)
*H01L 29/861* (2006.01)
*H01L 29/16* (2006.01)
*H01L 29/78* (2006.01)
*H01L 21/02* (2006.01)

(52) U.S. Cl.
CPC ...... *H01L 29/4236* (2013.01); *H01L 29/6606* (2013.01); *H01L 29/66068* (2013.01); *H01L 29/66136* (2013.01); *H01L 29/66348* (2013.01); *H01L 29/66734* (2013.01); *H01L 29/7397* (2013.01); *H01L 29/7813* (2013.01); *H01L 29/861* (2013.01); *H01L 21/0243* (2013.01); *H01L 21/02378* (2013.01); *H01L 21/02433* (2013.01); *H01L 21/02529* (2013.01); *H01L 21/02667* (2013.01)

(58) Field of Classification Search
CPC ............. H01L 29/66136; H01L 29/861; H01L 29/6606; H01L 29/66068; H01L 29/1608; H01L 29/7813; H01L 21/02609; H01L 21/02433; H01L 21/02378; H01L 21/0243; H01L 21/02667; H01L 21/02529
See application file for complete search history.

(56) References Cited

U.S. PATENT DOCUMENTS

| 2013/0168701 A1 | 7/2013 | Kiyosawa | |
| 2013/0183820 A1* | 7/2013 | Hiyoshi | H01L 21/3065 438/589 |
| 2016/0086798 A1* | 3/2016 | Tanaka | H01L 29/0657 257/77 |

FOREIGN PATENT DOCUMENTS

| JP | 2005-328014 A | 11/2005 |
| JP | 2007-234908 A | 9/2007 |
| JP | 2011-100967 A | 5/2011 |
| JP | 2012-146921 A | 8/2012 |
| JP | 2013-012590 A | 1/2013 |
| WO | WO 2014-103257 A1 | 7/2014 |
| WO | WO 2014-178094 A1 | 11/2014 |

OTHER PUBLICATIONS

Communication from the Japanese Patent Office Re Patent Application No. 2016-041251 (with translation). dated Jun. 5, 2017.

* cited by examiner

POWER SEMICONDUCTOR DEVICE INCLUDING TRENCH GATE STRUCTURES WITH LONGITUDINAL AXES TILTED TO A MAIN CRYSTAL DIRECTION

CROSS-REFERENCE TO RELATED APPLICATION

This application claims priority to German Application Serial No. 102015103070.5 filed Mar. 3, 2015 and entitled "Power Semiconductor Device Including Trench Gate Structures with Longitudinal Axes Tilted to a Main Crystal Direction".

BACKGROUND

Power semiconductor devices may withstand a blocking voltage of up to more than 1000 Volts at high current rating. Typically, a load current through a power semiconductor device flows in a vertical direction between the two principal planes of a semiconductor body of the power semiconductor device. Gate electrodes for controlling the load current may be formed in trench gate structures extending from one of the principal planes into the semiconductor body. In common semiconductor materials such as crystalline silicon the sidewalls of the trench gate structures may be approximately vertical sidewalls. In semiconductor bodies with a main crystal direction slightly tilted to the vertical direction by on off-axis angle of some few degrees, e.g., in some silicon carbide devices, a defined tapering of the trench gate structures may compensate for the off-axis angle such that gated inversion channels can be formed in main crystal planes with high charge carrier mobility.

It is desirable to improve device characteristics and device reliability of semiconductor devices.

SUMMARY

According to an embodiment a semiconductor device includes a semiconductor body with a first main crystal direction parallel to a horizontal plane. Longitudinal axes of trench gate structures are tilted to the first main crystal direction by a tilt angle of at least 2 degree and at most 30 degree in the horizontal plane. Mesa portions are between neighboring trench gate structures. First sidewall sections of first mesa sidewalls are main crystal planes parallel to the first main crystal direction. Second sidewall sections tilted to the first sidewall sections connect the first sidewall sections.

According to another embodiment a method of manufacturing a semiconductor device includes forming a trench in a semiconductor substrate from crystalline semiconductor material. In the semiconductor substrate a first main crystal direction is parallel to a horizontal plane. A longitudinal axis of the trench is tilted to the first main crystal direction by a tilt angle of at least 2 degree and at most 30 degree in the horizontal plane. In an inert atmosphere, the semiconductor substrate is heated up to a temperature at which atoms of the semiconductor material rearrange along main crystal planes, wherein redeposition regions form sidewalls steps that compensate an angular misalignment between the longitudinal axis of the trench and the main crystal planes. A sacrificial layer is formed that incorporates the redeposition regions.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the invention and are incorporated in and constitute a part of this specification. The drawings illustrate the embodiments of the present invention and together with the description explain principles of the invention. Other embodiments of the invention and intended advantages will be readily appreciated as they become better understood by reference to the following detailed description.

DETAILED DESCRIPTION

In the following detailed description, reference is made to the accompanying drawings, which form a part hereof and in which are shown by way of illustrations specific embodiments in which the invention may be practiced. Other embodiments may be utilized and structural or logical changes may be made without departing from the scope of the present invention. For example, features illustrated or described for one embodiment can be used on or in conjunction with other embodiments to yield yet a further embodiment. It is intended that the present invention includes such modifications and variations. The examples are described using specific language, which should not be construed as limiting the scope of the appending claims. The drawings are not scaled and are for illustrative purposes only. For clarity, the same or similar elements have been designated by corresponding references in the different drawings if not stated otherwise.

The terms "having", "containing", "including", "comprising" and the like are open, and the terms indicate the presence of stated structures, elements or features but do not preclude additional elements or features. The articles "a", "an" and "the" may include the plural as well as the singular, unless the context clearly indicates otherwise.

The term "electrically connected" describes a permanent low-ohmic connection between electrically connected elements, for example a direct contact between the concerned elements or a low-ohmic connection via a metal and/or heavily doped semiconductor. The term "electrically coupled" includes that one or more intervening element(s) adapted for signal transmission may be provided between the electrically coupled elements, for example elements that are controllable to temporarily provide a low-ohmic connection in a first state and a high-ohmic electric decoupling in a second state.

The Figures illustrate relative doping concentrations by indicating "−" or "+" next to the doping type "n" or "p". For example, "n−" means a doping concentration which is lower than the doping concentration of an "n"-doped region while an "n+"-doped region has a higher doping concentration than an "n"-doped region. Doped regions of the same relative doping concentration do not necessarily have the same absolute doping concentration. For example, two different "n"-doped regions may have the same or different absolute doping concentrations.

Figure 1A:
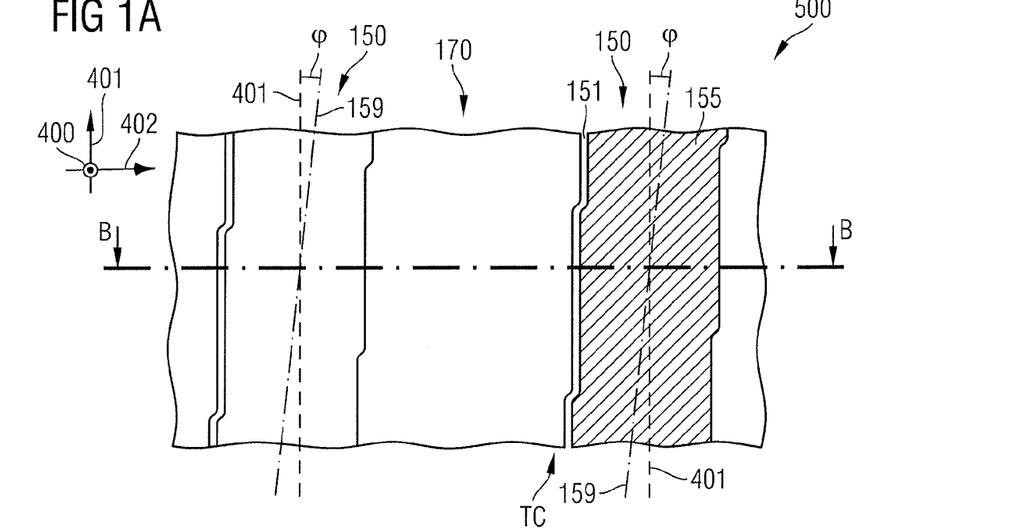
FIG. 1A is a schematic horizontal cross-sectional view of a portion of a semiconductor device according to an embodiment concerning trench gate structures with longitudinal axes that are tilted to a first main crystal direction.
Figure 1B:
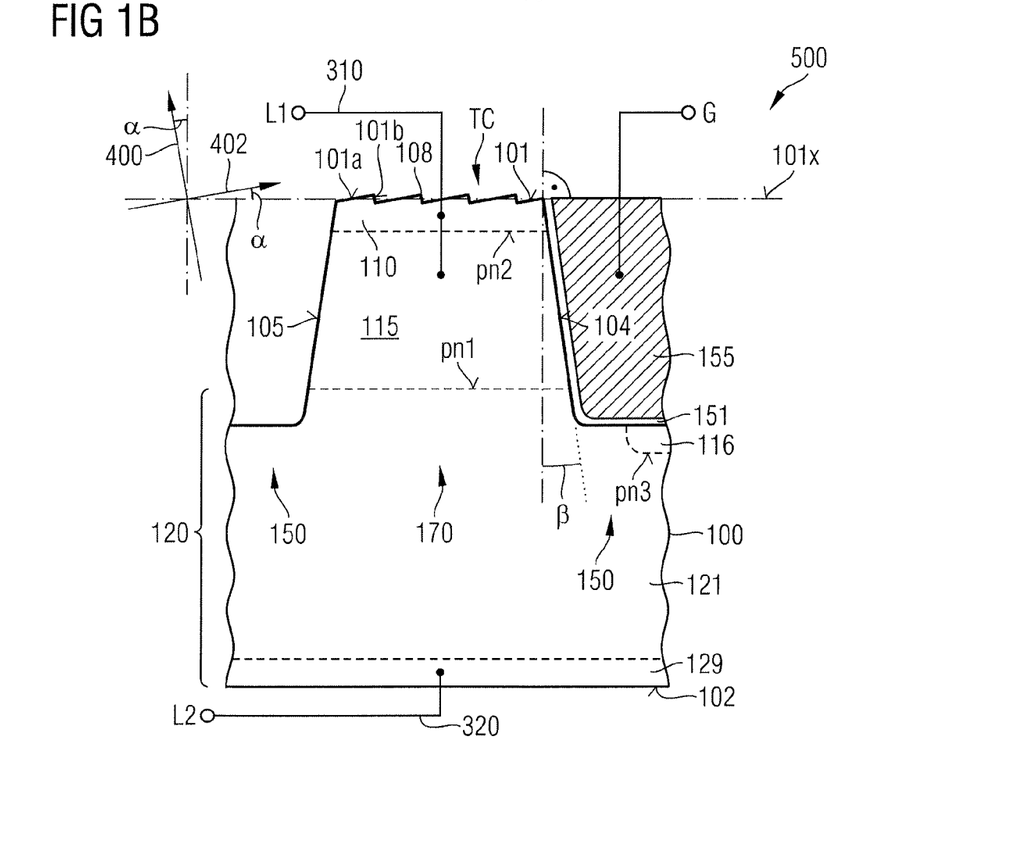
FIG. 1B is a schematic vertical cross-sectional view of the semiconductor device portion of FIG. 1A along line B-B.

FIGS. 1A to 1B refer to a semiconductor device 500 including transistor cells TC. The semiconductor device 500 may be or may include an IGFET (insulated gate field effect transistor), for example an MOSFET (metal oxide semiconductor FET) in the usual meaning including FETs with metal gates as well as FETs with non-metal gates, an IGBT (insulated gate bipolar transistor), or an MCD (MOS controlled diode), by way of example.

The semiconductor device 500 is based on a semiconductor body 100 from crystalline semiconductor material such as silicon (Si), germanium (Ge), silicon germanium (SiGe), gallium arsenide (GaAs) or any other $A_{III}B_V$ semiconductor. According to an embodiment, the crystalline semiconductor material has a hexagonal crystal lattice, such as silicon carbide (SiC) or an $A_{III}B_V$ semiconductor such as gallium nitride (GaN), by way of example. For example, the semiconductor material is silicon carbide of the 4H polytype (4H—SiC).

At a front side the semiconductor body 100 has a first surface 101 which may be planar or which may include coplanar surface sections, wherein the planar first surface 101 or the coplanar surface sections may coincide with a main crystal plane or may be tilted to a main crystal plane by an off axis angle α, which absolute value may be at least 2 degree and at most 12 degree, e.g., about 4 degree.

According to the illustrated embodiment, the first surface 101 is serrated and includes parallel first surface sections 101a, which are shifted to each other and tilted to a horizontal plane, as well as second surface sections 101b, which are tilted to the first surface sections 101a and which connect the first surface sections 101a. A cross-sectional line of the serrated first surface 101 approximates a saw-tooth line. The horizontal plane is parallel to a mean surface plane 101x given by the least squares mean plane of the first surface 101. In case of uniform length of the first surface sections 101a across the first surface 101, the mean surface plane 101x intersects steps 108 formed by the first and second surface sections 101a, 101b at the half step height. In case the first surface 101 is planar, the mean surface plane 101x coincides with the first surface 101.

According to an embodiment, a principal crystal direction 400 may be tilted to the normal to the mean surface plane 101x of the semiconductor body 100 by an off-axis angle α and the first surface sections 101a are tilted to the mean surface plane 101x by the off-axis angle α.

On the back an opposite second surface 102 may extend parallel or tilted to the mean surface plane 101x or may include surface sections parallel to the first and second surface sections 101a, 101b of the first surface 101. A distance between the first surface 101 at the front side and the second surface 102 on the back is related to a nominal blocking voltage the semiconductor device 500. Typically, the semiconductor body 100 includes a first vertical portion that accommodates the applied electric field in the blocking state, wherein the thickness of the first portion is proportional to the nominal blocking voltage and defines the electric field breakdown strength, whereas the thickness of further vertical portions, e.g., a substrate portion, is not related to the nominal blocking voltage.

A total thickness of the semiconductor body 100 between the first and second surfaces 101, 102 may be in the range of several hundred nm to several hundred μm. The normal to the mean surface plane 101x defines a vertical direction. Directions parallel to the mean surface plane 101x are horizontal directions.

The transistor cells TC are formed along trench gate structures 150, which extend from the first surface 101 into the semiconductor body 100, wherein portions of the semiconductor body 100 between neighboring trench gate structures 150 form mesa portions 170.

A longitudinal extension of the trench gate structures 150 along a first horizontal direction may be greater than a width along a second horizontal direction orthogonal to the first horizontal direction. The trench gate structures 150 may be long stripes extending from one side of a transistor cell area to an opposite side, wherein the length of the trench gate structures may be up to several millimeters. According to other embodiments a plurality of separated trench gate structures 150 may be arranged along a line extending from one side of the transistor cell area to the opposite side, or the trench gate structures 150 may form a grid with the mesa portions 170 formed in the meshes of the grid.

The trench gate structures 150 may be equally spaced, may have equal width, and may form a regular pattern, wherein a pitch (center-to-center distance) of the trench gate structures 150 may be in a range from 1 μm to 10 μm, e.g., from 2 μm to 5 μm. A vertical extension of the trench gate structures 150 may be in a range from 0.3 μm to 5 μm, e.g., in a range from 0.5 μm to 2 μm.

The trench gate structures 150 include a conductive gate electrode 155 which may include or consist of a heavily doped polycrystalline silicon layer or a metal-containing layer. The trench gate structures 150 further include a gate dielectric 151 separating the gate electrode 155 from the semiconductor body 100 along at least one side of the trench gate structure 150. The gate dielectric 151 may include or consist of a semiconductor dielectric, for example thermally grown or deposited semiconductor oxide, e.g., silicon oxide, a semiconductor nitride, for example deposited or thermally grown silicon nitride, a semiconductor oxynitride, for example silicon oxynitride, any other deposited dielectric material or any combination thereof. The gate dielectric 151 may be formed for a threshold voltage of the transistor cells TC in a range from 1.5 V to 6 V. In end portions of the trench gate structures 150 the gate dielectric 151 may be thicker than in active portions of the transistor cells TC to improve device reliability. According to an embodiment, the end portions may be completely filled with a dielectric material such as silicon oxide.

The trench gate structures 150 may exclusively include the gate electrode 155 and the gate dielectric 151 or may include further conductive and/or dielectric structures in addition to the gate electrode 155 and the gate dielectric 151.

The trench gate structures 150 may be vertical to the mean surface plane 101x or may taper with increasing distance to the mean surface plane 101x. For example, a taper angle β of the trench gate structures 150 with respect to the vertical direction may be equal to the off-axis angle α or may deviate from the off-axis angle α by not more than ±1 degree such that first mesa sidewalls 104 of the mesa portions 170 are formed by crystal planes providing high charge carrier mobility. For example, in a semiconductor body 100 with a hexagonal crystal lattice, the first mesa sidewalls 105 may be formed by A-planes or M-planes.

For the opposite second mesa sidewalls 105 the taper angle β adds to the off-axis angle α and a resulting angular misalignment γ between the second mesa sidewalls 105 and the crystal plane with high charge carrier mobility is the sum of the off-axis angle α and the taper angle β. Typically, the charge carrier mobility at the second mesa sidewalls 105 is significantly lower than at the first mesa sidewalls 104 and therefore cell layouts for semiconductor devices based on semiconductor bodies with an off-axis angle α of more than 2 degree avoid using the second mesa sidewalls 105 for gated inversion channels.

The mesa portions 170 include source zones 110 that are oriented to the front side and directly adjoin at least the first mesa sidewalls 104. The source zones 110 may directly adjoin the first surface 101 and may also directly adjoin the second mesa sidewalls 105 or may be spaced from the second mesa sidewalls 105.

The mesa portions 170 further include body zones 115 that separate the source zones 110 from a drift structure 120, wherein the body zones 115 form first pn junctions pn1 with the drift structure 120 and second pn junctions pn2 with the source zones 110. The body zones 115 directly adjoin the first mesa sidewalls 104 and may also directly adjoin the second mesa sidewalls 105. Portions of the body zones 115 are capacitively coupled to the gate electrode 155 through the gate dielectric 151. Both the source zones 110 and the body zones 115 are electrically connected to a first load electrode 310 at the front side. A vertical extension of the body zones 115 corresponds to a channel length of the transistor cells TC and may be in a range from 0.2 μm to 1.5 μm.

The semiconductor body 100 may further include diode regions 116 forming third pn junctions pn3 with a drift structure 120. The diode regions 116 are electrically connected or coupled to the first load electrode 310 and may vertically overlap with the trench gate structures 150 such that portions of the diode regions 116 are formed in the vertical projection of the trench gate structures 150. A distance between opposing edges of neighboring diode regions 116 may be in a range from 2 μm to 3 μm, by way of example.

The drift structure 120 is oriented to the back, may directly adjoin the second surface 102 and may be electrically connected or coupled to a second load electrode 320 through an ohmic contact or a further pn junction. The drift structure 120 may include a lightly doped drift zone 121 that may form the first and third pn junctions pn1, pn3 as well as a heavily doped contact layer 129 between the drift zone 121 and the second surface 102.

The net dopant concentration in the drift zone 121 may be in a range from $1E14$ $cm^{-3}$ to $3E16$ $cm^{-3}$ in case the semiconductor body 100 is formed from silicon carbide. A mean dopant concentration in the contact layer 129 is sufficiently high to ensure an ohmic contact with a second load electrode 320 that directly adjoins the second surface 102. In case the semiconductor device 500 is a semiconductor diode or an IGFET, the contact layer 129 has the same conductivity type as the drift zone 121. In case the semiconductor device 500 is an IGBT, the contact layer 129 has the complementary conductivity type of the drift zone 121 or includes zones of the complementary conductivity type.

Each of the first and second load electrodes 310, 320 may consist of or contain, as main constituent(s), aluminum (Al), copper (Cu), or alloys of aluminum or copper such as AlSi, AlCu or AlSiCu. According to other embodiments, at least one of the first and second load electrodes 310, 320 may contain, as main constituent(s), nickel (Ni), titanium (Ti), tungsten (W), tantalum (Ta), vanadium (V), silver (Ag), gold (Au), tin (Sn), platinum (Pt), and/or palladium (Pd). One of the first and second load electrodes 310, 320 or both may include two or more sub-layers, wherein each sub-layer contains one or more of Ni, Ti, V, Ag, Au, W, Sn, Pt, and Pd as main constituent(s), e.g., a silicide, a nitride and/or an alloy.

The first load electrode 310 may form or may be electrically connected or coupled to a first load terminal L1, which may be an anode terminal of an MCD, a source terminal of an IGFET or an emitter terminal of an IGBT. The second load electrode 320 may form or may be electrically connected or coupled to a second load terminal L2, which may be a cathode terminal of an MCD, a drain terminal of an IGFET or a collector terminal of an IGBT.

According to an embodiment, the transistor cells TC are n-channel FET cells with p-doped body zones 115 and n-doped source zones 110, wherein the diode regions 116 are p-doped and the drift zone 121 is n-doped. According to another embodiment, the transistor cells TC are p-channel FET cells with n-doped body zones 115 and p-doped source zones 110, wherein the diode regions 116 are n-doped and the drift zone 121 is p-doped.

When a potential at the gate electrode 155 exceeds or falls below a threshold voltage of the semiconductor device 500, minority charge carriers in the body zones 115 form inversion channels connecting the source zones 110 with the drift structure 120, thereby turning on the semiconductor device 500. In the on-state, a load current flows through the semiconductor body 100 approximately along the vertical direction between the first and second load electrodes 310, 320.

In the following the first main crystal direction 401 is a crystal direction that is orthogonal to the principal crystal direction 400 and parallel to the mean surface plane 101x. The second main crystal direction 402 is a crystal direction that is orthogonal to the principal crystal direction 400 and the first main crystal direction 401. The second main crystal direction 402 may be in the horizontal plane when the principal crystal direction 400 is vertical to the mean surface plane 101x or may be tilted to the mean surface plane 101x when the principal crystal direction 400 is tilted to the mean surface plane 101x.

For example, in a semiconductor body 100 with hexagonal crystal lattice the principal crystal direction may be the <0001> crystal direction. The first main crystal direction may be the <11-20> direction and the second main crystal direction may be the <1-100> direction or the first main crystal direction may be the <1-100> direction and the second main crystal direction may be the <11-20> direction.

Longitudinal axes 159 of the trench gate structures 150 are tilted to the first main crystal direction 401 by a tilt angle φ of at least 2 degree and at most 30 degree. According to an embodiment the tilt angle φ is in a range from 3 degree to 8 degree. With increasing tilt angle φ a distance between approximately vertical steps generated during manufacture of the semiconductor device 500 in the first and second mesa sidewalls 104, 105 by a rearrangement of atoms along the crystal planes decreases. During the rearrangement of atoms, dopants contained in the crystal lattice may be set free from dissolving portions of the crystal lattice and may be incorporated in newly grown portions of the crystal lattice at a different distribution, e.g., at a lower overall concentration or at lower density uniformity. Different dopant types may behave differently such that in counterdoped regions the conductivity type may locally change from n-type to p-type or vice versa. In addition, the dopant concentration in regions adjoining the dissolved and newly grown portions may be affected. The semiconductor portions in which the dopant concentration is affected by the rearrangement of atoms along the crystal planes form redeposition regions of potentially different dopant concentration. The redeposition regions may form intrinsic or n-type passages through the body zones 115 along the first mesa sidewall 104, wherein such passages increase the leakage current of the semiconductor device 500.

The greater the tilt angle φ is, the more steps can form along the sidewalls and the narrower is a distance between the steps. The higher the step density is, the more uniform the material redeposits along the sidewalls and the narrower the redeposition regions of potentially different dopant concentration are along the steps. The narrower the redeposition regions are, the lower a thermal load caused by a thermal oxidation process is for removing the redeposition regions, which otherwise may locally increase the leakage current density in the semiconductor device 500 in the off-state.

With the tilt angle φ in the mentioned ranges, a distance between the vertical steps generated during manufacture of the semiconductor device 500 in the first mesa sidewalls 104 is sufficiently narrow to significantly reduce the thermal load for removing the regions of potentially different dopant concentration formed by the rearrangement of atoms along the first mesa sidewalls 104 during a thermal treatment as discussed in more detail in the following.

Figure 2:
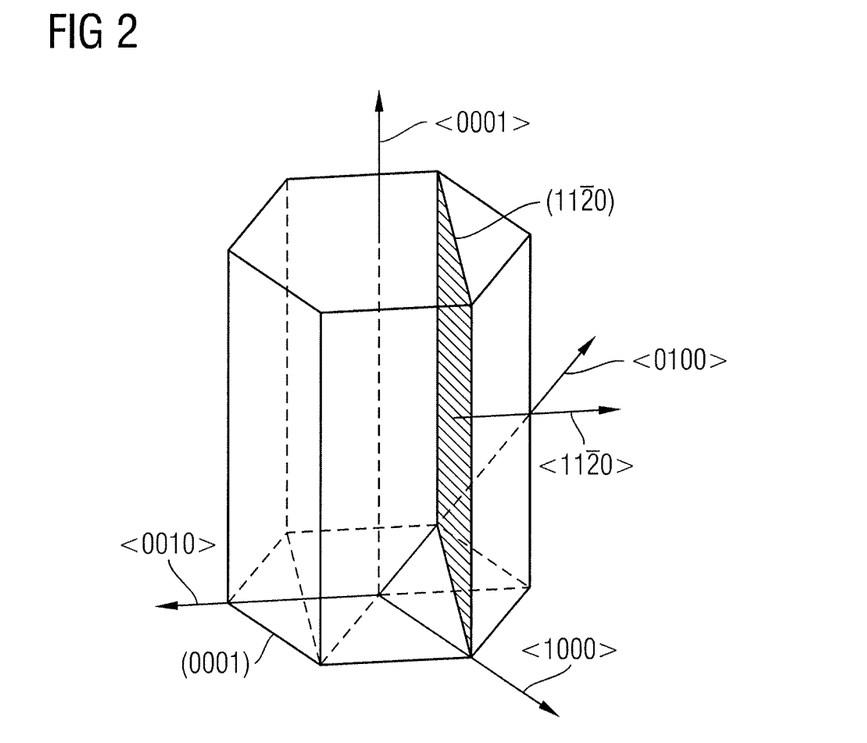
FIG. 2 schematically shows a part of a hexagonal crystal lattice for discussing background of the embodiments.

FIG. 2 shows the crystal planes and crystal directions in a part of a hexagonal crystal lattice, e.g., the 4H—SiC crystal lattice. The <0001> crystal direction is perpendicular to the (0001) basal plane or C-plane. Planes perpendicular to the C-plane are main crystal planes such as the {1-100} crystal planes or M-planes and the {11-20} crystal planes or A-planes. For example, in 4H—SiC the A-planes and the M-planes show high charge carrier mobility, wherein the charge carrier mobility in the {11-20} crystal planes is higher than in the {1-100} crystal planes. The A-planes are members of a set of planes including the (11-20), (1-210), (−2110), (2-1-10), (−12-10) and (−1-120) planes. The following description refers to the (11-20) plane as an arbitrary one of the A-planes and to the (1-100) plane as an arbitrary one of the M-planes.

Figure 3A:
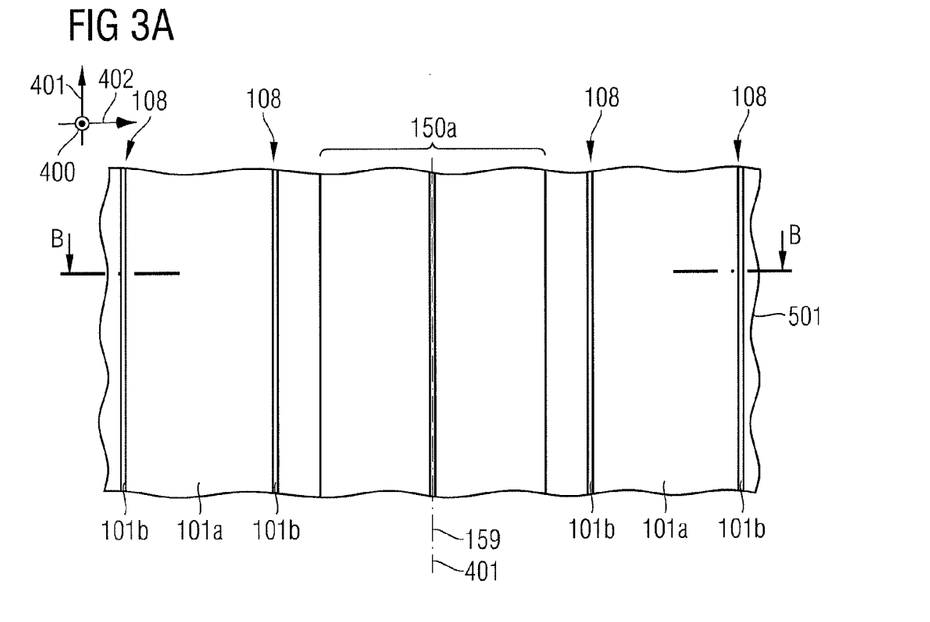
FIG. 3A is a schematic plan view of a top surface of a portion of a semiconductor wafer with the longitudinal axis of a trench gate structure in perfect alignment with a vertical projection of a first main crystal direction into a horizontal plane for discussing background helpful for the understanding of the embodiments.
Figure 3B:
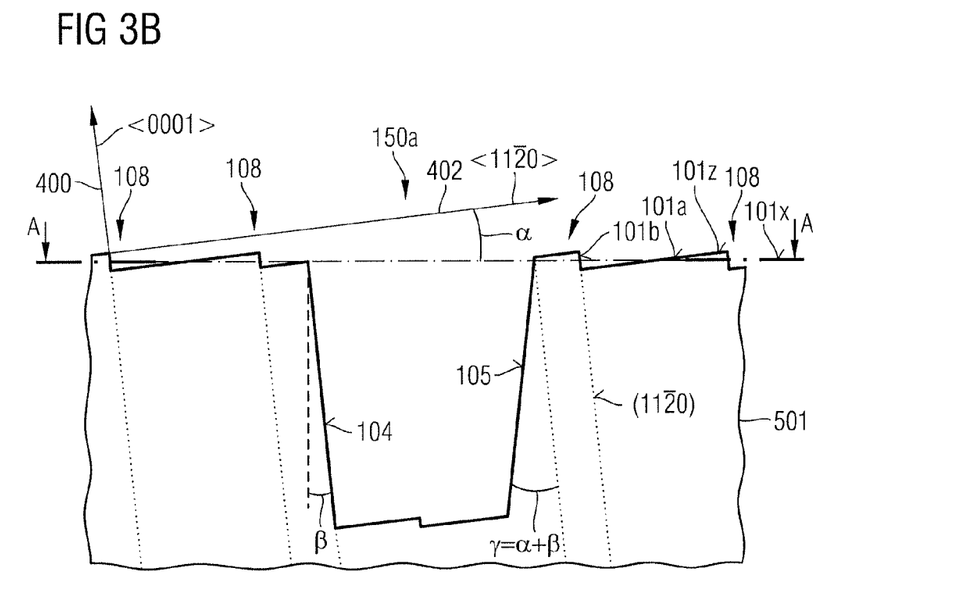
FIG. 3B is a schematic vertical cross-sectional view of the semiconductor wafer portion of FIG. 3A along line B-B.

FIGS. 3A and 3B show a top surface of a wafer 501 with a hexagonal crystal lattice. A principal crystal direction 400 may be the <0001> crystal direction. The top surface 101z with parallel first surface sections 101a and second surface sections 101b tilted to the first surface sections 101a is the result of a heating treatment of a wafer obtained from cutting a crystal ingot at an off-axis angle α with respect to the {0001} crystal planes, wherein the direction of the cut is along a main crystal direction 402, which may be the <11-20> crystal direction or the <1-100> direction. In both cases, the off-axis angle α between the cut plane and the (0001) crystal plane may be any angle in a range from about 2 to 12 degree. During the mentioned heating treatment, the atoms along the cut plane rearrange and form the serrated top surface 101z.

The first and second surface sections 101a, 101b form steps 108, wherein the steps 108 in total are symmetric with respect to a mean surface plane 101x, which is tilted to the main crystal direction 402 by the off-axis angle α. The cut plane may coincide with or may be parallel to the mean surface plane 101x that cuts the first and second surface sections 101a, 101b approximately at the half mean step height. The first surface sections 101a are parallel to a main crystal direction 402 orthogonal to the crystal direction 400. The second surface sections 101b are tilted to the first surface sections 101a by an angle greater 0 degree. For example, the second surface sections 101b may be approximately parallel to the crystal direction 400.

When an epitaxial layer is grown on the staggered top surface 101z by step-controlled epitaxy, the edges at the steps 108 between first and second surface sections 101a, 101b order the impinging silicon and carbon atoms in a way such that the grown epitaxial layer reliably continues the 4H—SiC crystal structure. A chemical-mechanical polishing may flatten the top surface 101z and a passivation layer, e.g., a carbon layer, may suppress further redeposition during following processes.

A trench 150a for a trench gate structure extends from the top surface 101z into the semiconductor body 100 and may taper with increasing distance to the top surface 101z at a taper angle β with respect to the vertical direction. If the taper angle β and the off axis angle α are equal, a first mesa sidewall 104 of the trench 150a is formed by main crystal planes, e.g., the A-planes or M-planes, whereas an opposite second mesa sidewall 105 is tilted to the respective main crystal planes by an angular misalignment γ=α+β.

Since electron mobility strongly depends on crystal orientation, an inversion channel formed along the second mesa sidewall 105 is significantly less effective than an inversion channel formed along the first mesa sidewalls 104.

The first mesa sidewall 104 is smooth and without steps only if the longitudinal axis of the trench 150a is perfectly parallel to the main crystal plane forming the first mesa sidewall 104.

Figure 4A:
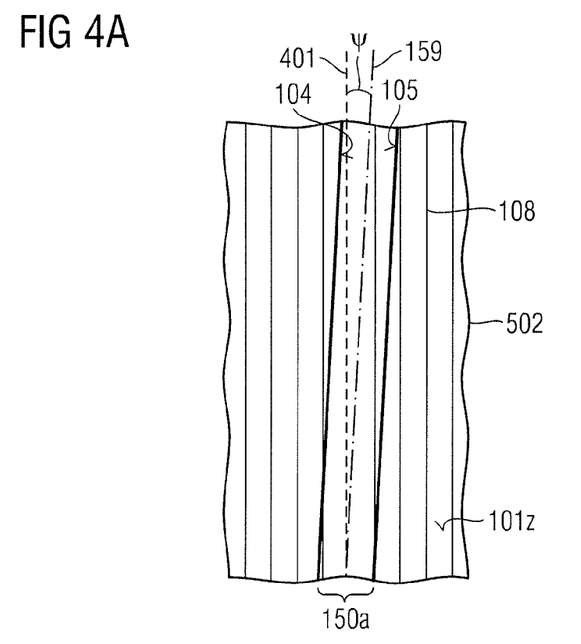
FIG. 4A is a schematic plan view of a portion of a semiconductor substrate with a stripe-shaped trench slightly tilted to a first main crystal direction for discussing background useful for the understanding of the embodiments, after etching the trench and before a thermal treatment.

FIG. 4A shows a semiconductor substrate 502 with a trench 150a. A longitudinal axis 159 of the trench 150a slightly deviates from the first main crystal direction 401. The angular misalignment ψ may be less than one degree and results from an angular misalignment between a photolithographic mask used for defining the trench 150a and a mark indicating the crystal orientation in the semiconductor substrate 502. The first and second mesa sidewalls 104, 105 cut the main crystal planes parallel to the first main crystal direction 401 which runs parallel to the steps 108 in the top surface 101z of the semiconductor substrate 510.

Then, during a high temperature process, e.g., a doping activation anneal or a surface smoothing treatment, the atoms of the crystal lattice rearrange along the first and second mesa sidewalls 104, 105 to take energetically more favorable positions within main crystal planes.

Figure 4B:
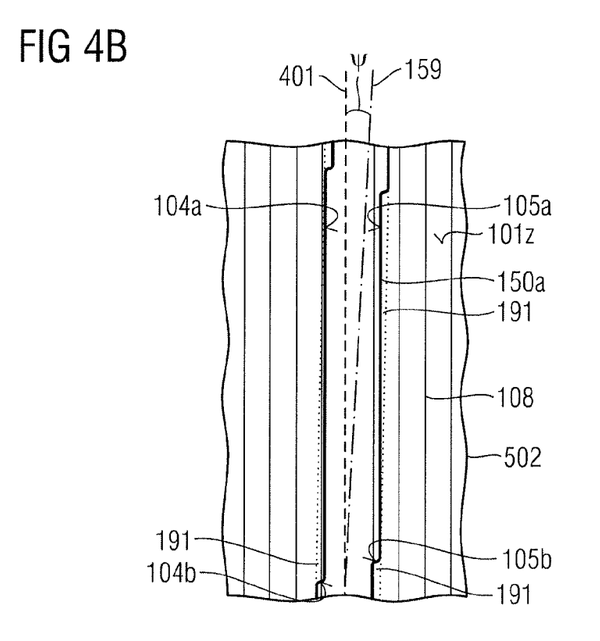
FIG. 4B is a schematic plan view of the semiconductor substrate portion of FIG. 4A after a thermal treatment.

FIG. 4B shows the result of the high temperature process. The atoms have rearranged in long flat first sidewall sections 104a, 105a formed by main crystal planes, e.g., A-planes or M-planes. Short second sidewall sections 104b, 105b connecting neighboring first sidewall sections 104a, 105a compensate for the deviation of the longitudinal axis 159 of the trench 150a from the orientation of the main crystal planes forming the mesa sidewalls 104, 105. Transitions between the first and second sidewall sections 104a, 105a; 104b, 105b form steps, wherein formation of the steps is related to the crystal planes cut by the first and second mesa sidewalls 104, 105. At a low angular misalignment ψ the first and second mesa sidewalls 104, 105 cut a comparatively low number of crystal planes and the number of steps is low. The redeposited or surface-diffused material distributes over a low number of steps resulting in comparatively high steps.

The rearrangement of atoms of the crystal lattice may result in a segregation of dopant atoms which may accumulate or deplete in redeposition regions 191 that extend along the first sidewalls sections 104a, 105a. A horizontal cross-section of the redeposition regions 191 is a triangle, wherein a first side of the triangle is formed by the concerned first sidewall section 104a, 105a and a second side is approximately the adjoining half of the second sidewall section 104b, 105b forming a sidewall step 106 with the concerned first sidewall section 104b, 105b. The maximum thickness of the redeposition region is about half the step height. The redeposition regions 191 may locally change the characteristics of inversion channels formed in the first mesa sidewalls 104 and may degrade device reliability.

FIGS. 5A to 5D refer to a method of manufacturing a semiconductor device, e.g., an MCD or a semiconductor switching device such as in IGFET or an IGBT.

Figure 5A:
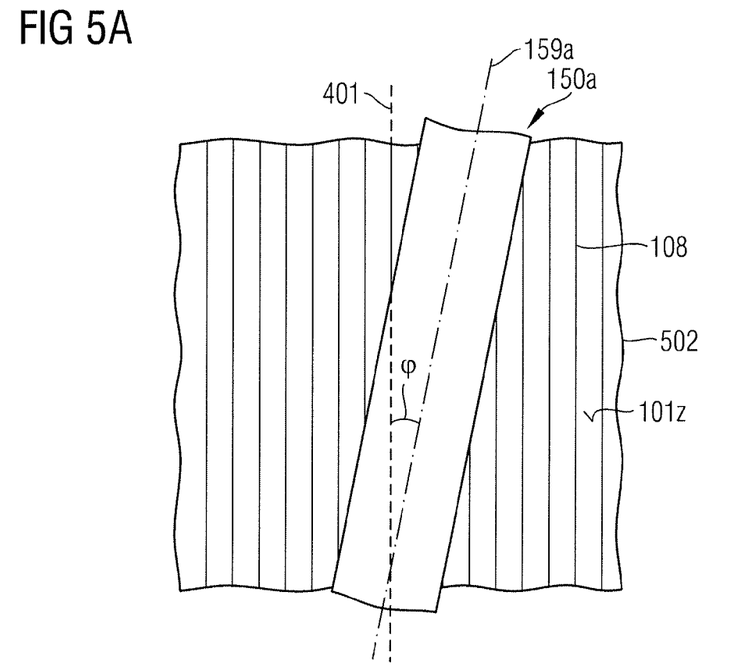
FIG. 5A is a schematic plan view of a portion of a semiconductor substrate with a stripe-shaped trench with its longitudinal axis tilted by a tilt angle of at least two degree to a first main crystal direction for illustrating a method of manufacturing a semiconductor device according to another embodiment, after etching the trench.

A trench 150a is formed, e.g., by a masked, anisotropic etch in a semiconductor substrate 502 from crystalline semiconductor material. In the semiconductor substrate 502 a principal crystal direction may be tilted by an off-axis angle of at least 2 degree to a normal on a mean surface plane at a front side of the semiconductor substrate 502, wherein the mean surface plane may intersect steps 108 in a top surface 101z at half step height. The trench 150a extends from the top surface 101z into the semiconductor substrate 502. The semiconductor substrate 502 contains dopants which may be incorporated during an epitaxial growth or which may be implanted before or after formation of the trench 150a.

As shown in FIG. 5A, a longitudinal axis 159a of the trench 150a is tilted to a first main crystal direction 401 by a tilt angle φ which is at least 2 degree, e.g., at least 3 degree or at least 5 degree and at most 30 degree, e.g. at most 12 degree. The trench 150a intersects main crystal planes, e.g., the (11-20) or the (1-100) crystal planes of a hexagonal crystal lattice at the tilt angle φ. In the illustrated embodiment, the tilt angle φ corresponds to an angle between the longitudinal axis 159a of the trench 150a and a first main crystal direction 401.

The semiconductor substrate 502 is heated up to a temperature at which surface atoms of the semiconductor substrate 502 move to energetically more favorable positions within main crystal planes. The heating may be a thermal treatment for activating implanted dopants or may be a process primarily aiming at smoothing surface roughness or rounding trench edges, by way of example. The temperature of the thermal treatment may be in a range from 1400 to 1700 degree and may be performed in an inert atmosphere containing hydrogen gas ($H_2$) or a noble gas such as argon (Ar) or xenon (Xe), by way of example. In addition, the inert atmosphere may contain hydrocarbons.

Figure 5B:
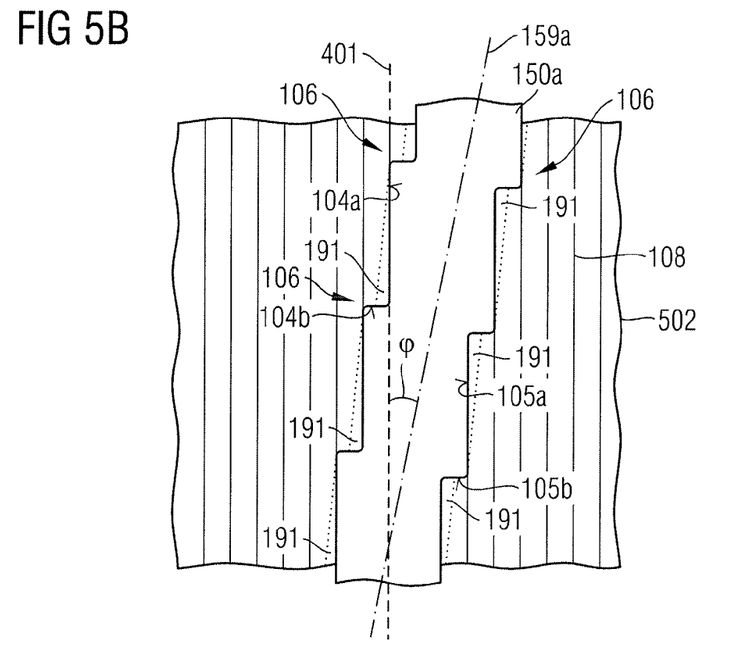
FIG. 5B is a schematic plan view of the semiconductor substrate portion of FIG. 5A after a thermal treatment.

As illustrated in FIG. 5B the rearrangement of atoms of the semiconductor material results in long flat first sidewall sections 104a, 105a parallel to the main crystal planes and short second sidewall sections 104b, 105b connecting neighboring first sidewall sections 104a, 105a and compensating the angular misalignment of the trench 105a with respect to the main crystal planes. The second sidewall sections 104b, 105b may be approximately perpendicular to the first sidewall sections 104a, 105a. The first and second sidewall sections 104a, 105a, 104b, 105b form approximately vertical sidewall steps 106.

Since the tilt angle φ is greater than the angular misalignment ψ of FIGS. 4A to 4B, the trench 150a intersects more crystal planes per length unit. Since formation of the sidewall steps 106 is linked to the number of cut crystal planes, more sidewall steps 106 can form per length unit than in the example of FIGS. 4A to 4B. The redeposited material disperses over a greater number of redeposition regions 191, in which the dopant concentration may vary from a target value due to segregation and/or accumulation processes. The depth extension of each single redeposition region 191 is smaller than the depth extension of redeposition regions formed by a conventional method with only a low number of sidewall steps 106.

Figure 5C:
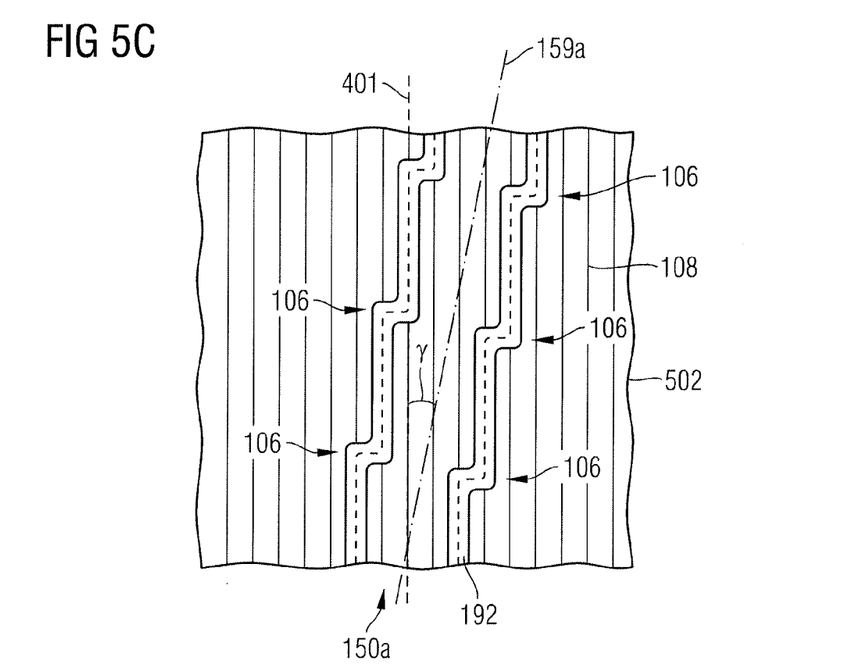
FIG. 5C is a schematic plan view of the semiconductor substrate portion of FIG. 5B after forming a sacrificial layer.

A sacrificial layer 192 is formed that incorporates surface portions of the semiconductor substrate 502 along exposed surface sections such as the first and second mesa sidewalls 104, 105. According to an embodiment, the sacrificial layer 192 may be a semiconductor oxide layer formed by thermal oxidation of the semiconductor material of the semiconductor substrate 502. A thickness of the sacrificial layer 192 is in a range of several ten nanometers, e.g., at most 300 nm. The thickness of the sacrificial layer 192 may depend on the crystal orientation. For example, first portions of the sacrificial layer 192 grown on the first sidewall sections 104a, 105a may be thinner or thicker than second portions of the sacrificial layer 192 grown on the second sidewall sections 104b, 105b.

FIG. 5C shows the sacrificial layer 192. Since the extension of the redeposition regions 191 is smaller, a thinner sacrificial layer 192 suffices to consume a greater portion of each dopant accumulation region 106. A thermal load for removing the dopant accumulation regions can be significantly reduced. The saved thermal budget may be applied in other processes or may contribute in the formation of more precisely defined dopant regions and, as a consequence, in reduced fluctuations of device parameters.

Figure 5D:
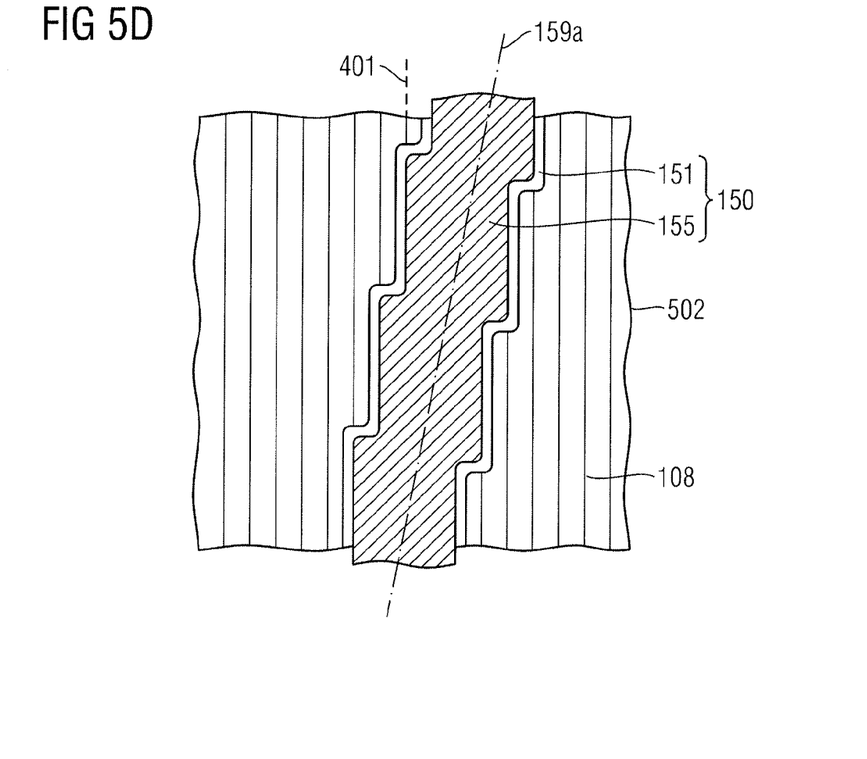
FIG. 5D is a schematic plan view of the semiconductor wafer portion of FIG. 5C after forming a trench gate structure.

The sacrificial layer 192 may be removed. A gate dielectric 151 may be formed along at least the first mesa sidewall 104. A gate electrode 155 may fill at least a portion of the trench 150a adjoining the first mesa sidewall 104 to form a trench gate structure 150 in the trench 150a.

FIG. 5D shows the trench gate structure 150 with the gate electrode 155 separated from the semiconductor material of the semiconductor substrate 502 by the gate dielectric 151. By forming and removing the sacrificial layer 192 of FIG. 5C, no regions with unintentionally different dopant concentration remain that adjoin the first mesa sidewall 104. A semiconductor device obtained from the semiconductor substrate 502 shows uniform dopant concentrations along the first mesa sidewalls 104 and gated inversion channels formed in the first mesa sidewalls 104 during an on-state of the semiconductor device show uniform current density.

Figure 6A:
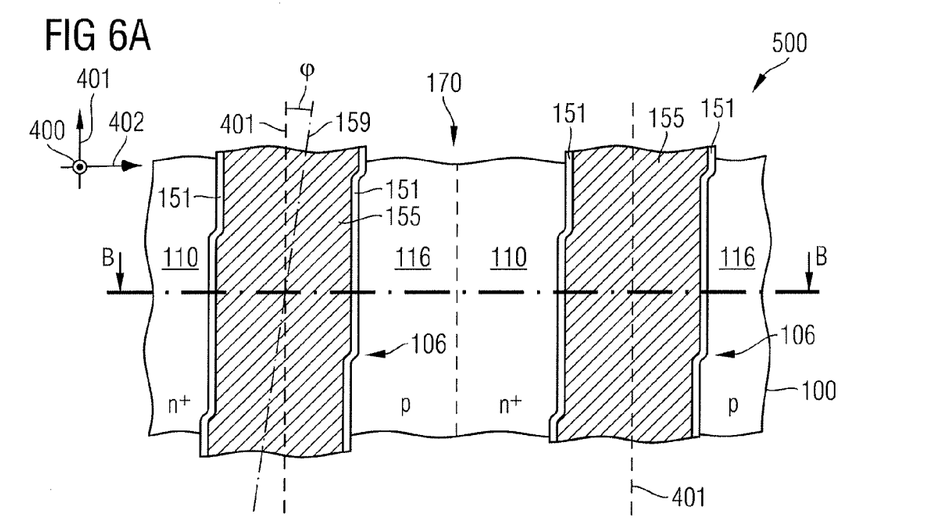
FIG. 6A is a schematic horizontal cross-sectional view of a portion of a semiconductor device according to an embodiment concerning an IGFET (insulated gate field effect transistor) including mesa portions with transistor cells at a first side.
Figure 6B:
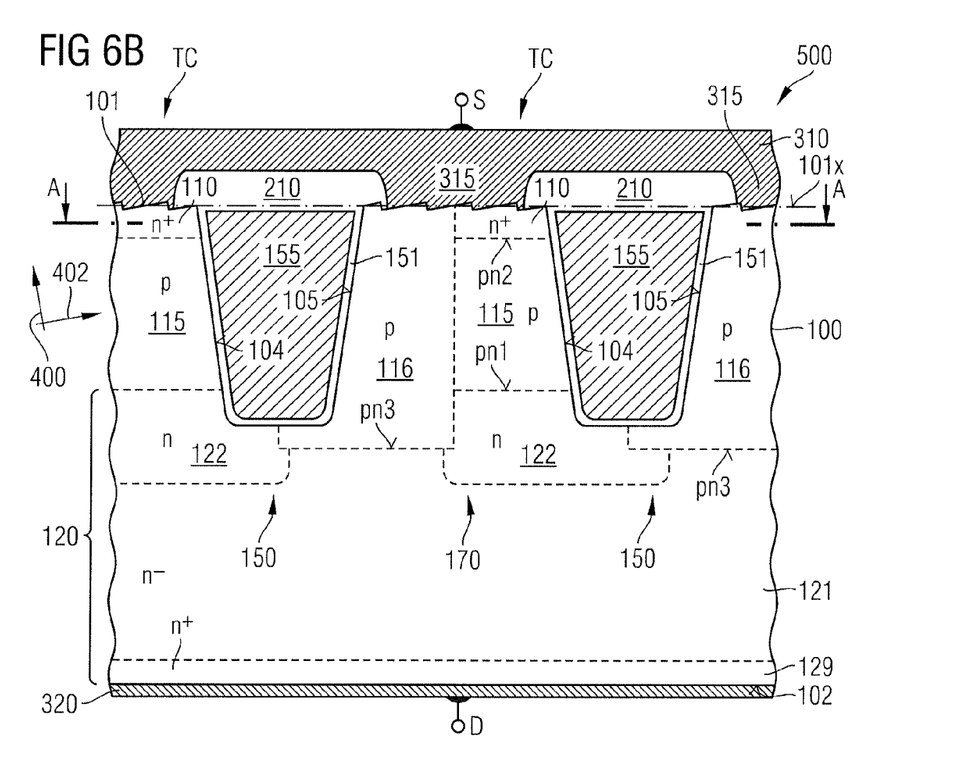
FIG. 6B is a schematic vertical cross-sectional view of the semiconductor device portion of FIG. 6A along line B-B.

The semiconductor device 500 of FIGS. 6A and 6B is a silicon carbide IGFET based on the semiconductor device 500 of FIGS. 1A to 1B, wherein the first load electrode 310 forms or is electrically connected or coupled to a source terminal S and the second load electrode 320 forms or is electrically connected to a drain terminal D.

In FIG. 6A the principal <0001> crystal direction 400 is slightly tilted to the perpendicular on the drawing plane by an off-axis angle α between 2 degree and 8 degree, for example about 4 degree. A first main crystal direction 401, which is orthogonal to the <0001> crystal direction and parallel to a mean surface plane 101x, e.g., the <1-100> crystal direction or the <11-20> crystal direction, is in the drawing plane. A second main crystal direction 402, which is orthogonal to both the <0001> crystal direction and the first main crystal direction 401 may be slightly tilted to the drawing plane by the off-axis angle α. The first surface 101 may be flat. According to the illustrated embodiment the first surface 101 is serrated.

Longitudinal axes 159 of the trench gate structures 150 are tilted to the first main crystal direction 401 by a tilt angle φ of at least 2 degree, for example at least 3 or 5 degree and at most 30 degree, e.g., at most 12 degree. First mesa sidewalls 104 of mesa portions 170 are (11-20) crystal planes or (1-100) crystal planes or deviate from such planes by an angular misalignment of not more than ±1 degree.

In FIG. 6B the <0001> crystal direction is tilted by the off-axis angle α to the normal onto the mean surface plane 101x. The first main crystal direction 401 is perpendicular to the drawing plane and the second main crystal direction 402 is tilted by the off-axis angle α to the mean surface plane 101x.

The trench gate structures 150 are stripe shaped with sidewall steps 106. A mean distance between neighboring sidewall steps 106 depends on the tilt angle φ and the step height, wherein the step height depends on process parameters and may be in a range from few nm to few 10 nm. For example at a step height of 20 nm and a tilt angle φ of about 10 degree, the mean distance may be about 120 nm. The trench gate structures 150 may be equally spaced from each other, may have uniform width, and may extend from one side of a transistor cell area to the opposite side.

An interlayer dielectric 210 sandwiched between the first load electrode 310 and the gate electrode 155 dielectrically insulates the first load electrode 310 from the gate electrode 155. The interlayer dielectric 210 may include one or more dielectric layers from silicon oxide, silicon nitride, silicon oxynitride, doped or undoped silicate glass, for example BSG (boron silicate glass), PSG (phosphorus silicate glass) or BPSG (boron phosphorus silicate glass), by way of example.

Contact structures 315 extend from the first load electrode 310 through openings in the interlayer dielectric 210 to the semiconductor body 100 and directly adjoin at least the source zones 110. According to the illustrated embodiment the contact structures 315 end on the first surface 101. According to other embodiments, the contact structures 315 may extend into the semiconductor body 100.

In the mesa portions 170 the source zones 110 and the body zones 115 directly adjoin the first mesa sidewalls 104. The diode regions 116 may directly adjoin opposite second mesa sidewalls 105 and may directly adjoin the first surface 101 and/or the contact structures 315. A vertical extension of the diode regions 116 may be greater than a vertical extension of the trench gate structures 150 such that portions of the diode regions 116 overlap with the vertical projection of the trench gate structures 150 and shield active portions of the gate dielectric 151 against the high potential of the second load electrode 320 in a blocking state of the semiconductor device 500. The diode regions 116 form third pn junctions pn3 with the drift structure 120 and provide a fly back diode functionality integrated in the semiconductor device 500. Further, the diode regions 116 may connect the body zones 115 with the contact structures 315.

The drift structure 120 may include current spread zones 122 which may directly adjoin the body zones 115. The current spread zones 122 may extend between neighboring diode regions 116, wherein unipolar homojunctions between the current spread zones 122 and the drift zone 121 may have a greater distance to the first surface 101 than the third pn junctions pn3 formed between the diode regions 116 and the drift zone 121. Portions of the current spread zones 122 may overlap with the vertical projection of the diode regions 116 and may extend between neighboring diode regions 116.

A mean net dopant concentration in the current spread zones 122 is at least ten times as high as a mean net dopant concentration in the drift zone 121. The reduced horizontal resistance of the current spread zones 122 laterally spreads an on-state current of the transistor cells TC such that a current distribution in the drift zone 121 is more uniform. For further details reference is made to the description of the previous Figures.

Figure 7A:
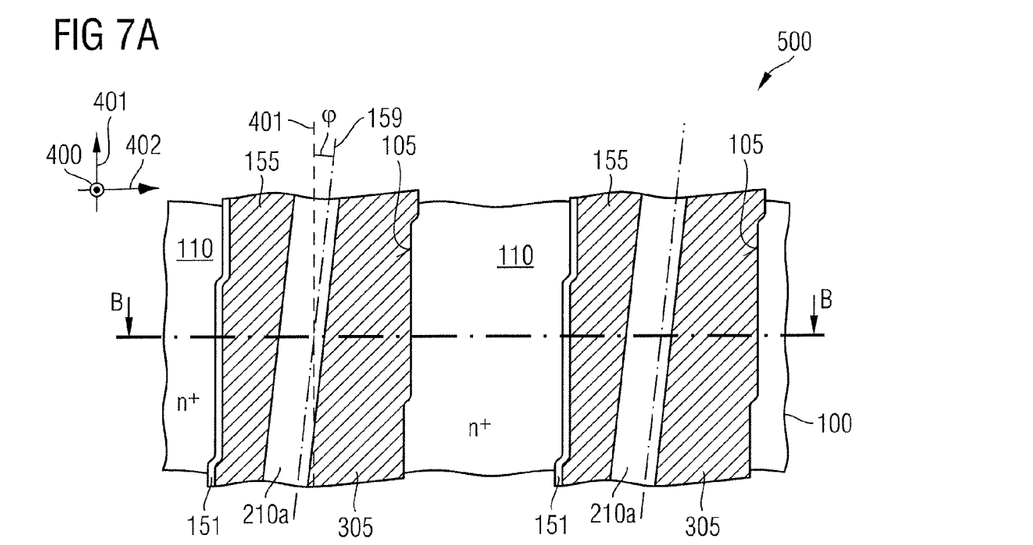
FIG. 7A is a schematic horizontal cross-sectional view of a portion of a semiconductor device according to an embodiment related to an IGFET with spacer gate electrodes.
Figure 7B:
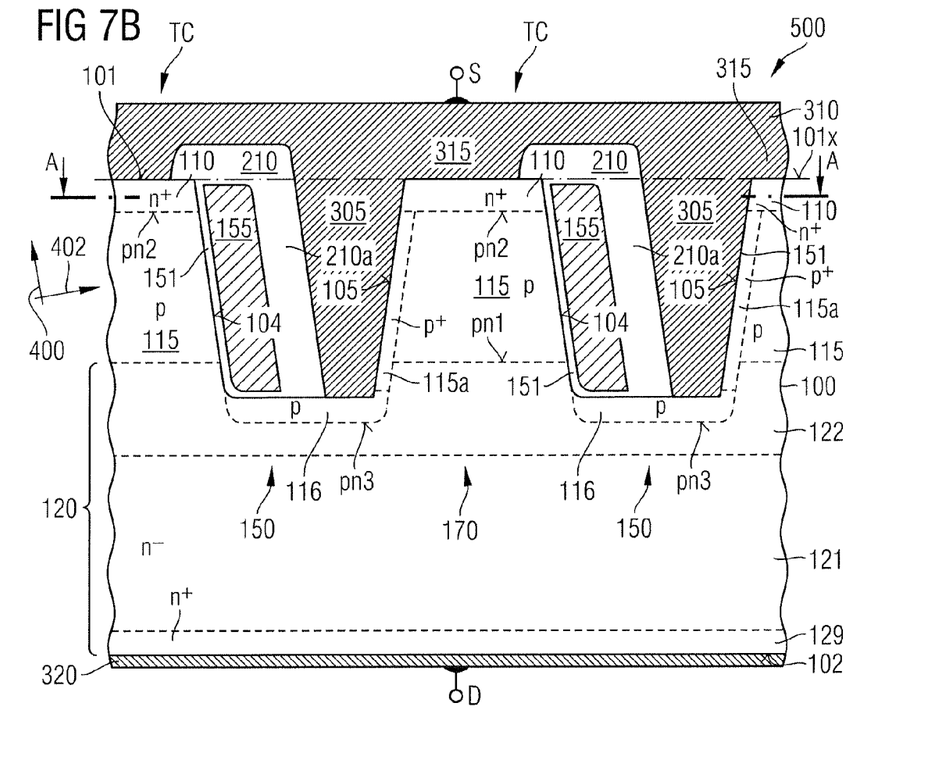
FIG. 7B is a schematic vertical cross-sectional view of the semiconductor device portion of FIG. 7A along line B-B.

In FIG. 7A, the crystal directions are the same as in FIG. 6A and in FIG. 7B the same as in FIG. 6B. The first surface 101 may result from an epitaxy process and may be serrated. According to the illustrated embodiment, the first surface 101 is planar. For example, a chemical-mechanical polishing may planarize the serrated surface of an epitaxial layer and a passivation layer, e.g., a carbon layer, may suppress redeposition of the silicon and carbon atoms along main crystal planes during following heating processes.

In addition to the gate electrode 155, the trench gate structures 150 may include diode contact structures 305 that extend from the contact structures 315 to the bottom of the trench gate structures 150 and that form ohmic contacts with the diode regions 116, which are formed in the vertical projection of the trench gate structures 150 between the trench gate structures 150 and the drift structure 120.

The gate electrode 155 is a spacer gate formed only along the first mesa sidewalls 104. Trench portions 210a of the interlayer dielectric 210 are sandwiched between the gate electrode 155 and the diode contact structure 305 and insulate the gate electrode 155 and the diode contact structures 305 from each other. Along the second mesa sidewalls 105 heavily doped contact zones 115a may form ohmic contacts between the body zones 115 and the diode contact structures 305. For further details reference is made to the description of the previous Figures.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device comprising:
a semiconductor body with a first main crystal direction parallel to a horizontal plane,
trench gate structures with a longitudinal extension greater than a width in a same direction of the horizontal plane, wherein a longitudinal axis of each trench gate structure of the trench gate structures is tilted to the first main crystal direction by a tilt angle of at least 2 degree and at most 30 degree in the horizontal plane; and
mesa portions between neighboring trench gate structures, wherein first sidewall sections of first mesa sidewalls are first main crystal planes parallel to the first main crystal direction and second sidewall sections of the first mesa sidewalls tilted to the first sidewall sections connect the first sidewall sections.

2. The semiconductor device of claim 1, wherein the horizontal plane is parallel to a mean surface plane of the semiconductor body.

3. The semiconductor device of claim 1, wherein a second main crystal direction orthogonal to the first main crystal direction is tilted to the horizontal plane by an off-axis angle of at least 2 degree.

4. The semiconductor device of claim 1, wherein a first surface of the semiconductor body comprises first surface sections and second surface sections, which are tilted to the first surface sections and which connect the first surface sections.

5. The semiconductor device of claim 4, wherein the first surface sections are second main crystal planes parallel to a second main crystal direction.

6. The semiconductor device of claim 3, wherein the off-axis angle is in a range from 3 to 12 degree.

7. The semiconductor device of claim 1, wherein the tilt angle is in a range from 3 to 12 degree.

8. The semiconductor device of claim 1, wherein the semiconductor body has a hexagonal crystal lattice and the first main crystal direction is one of the <11-20> crystal direction and the <1-100> crystal direction.

9. The semiconductor device of claim 1, wherein a first surface of the semiconductor body comprises first surface sections formed by (1-100) crystal planes and second surface sections tilted to the first surface sections by an angle greater than 0 degree and connecting the first surface sections.

10. The semiconductor device of claim 1, wherein a first surface of the semiconductor body comprises first surface sections formed by (11-20) crystal planes and second surface sections tilted to the first surface sections by an angle greater than 0 degree and connecting the first surface sections.

11. The semiconductor device of claim 1, wherein the semiconductor body is based on silicon carbide of a 4H polytype.

12. The semiconductor device of claim 2, wherein the mesa portions comprise body zones forming first pn junctions with a drift structure and second pn junctions with source zones, the source zones formed between the body zones and the mean surface plane.

13. The semiconductor device of claim 12, further comprising:
diode regions forming third pn junctions with the drift structure and overlapping with the trench gate structures in a vertical projection orthogonal to the mean surface plane.

14. The semiconductor device of claim 1, wherein the trench gate structures taper at a taper angle which deviates from an off-axis angle by not more than ±1 degree.

15. The semiconductor device of claim 1, wherein a depth of the trench gate structures is in a range from 0.5 µm to 2.0 µm.

* * * * *